US012617967B2

(12) United States Patent
Griesser et al.

(10) Patent No.: US 12,617,967 B2
(45) Date of Patent: May 5, 2026

(54) INK COMPOSITION, KIT, METHOD OF MANUFACTURING A DEFORMABLE CONDUCTOR UTILIZING THE INK COMPOSITION, DEFORMABLE CONDUCTOR, ELECTRONIC DEVICE COMPRISING THE DEFORMABLE CONDUCTOR, METHOD OF MANUFACTURING A CONDUCTOR, CONDUCTOR AND ELECTRONIC DEVICE COMPRISING THE CONDUCTOR

(71) Applicant: MONTANUNIVERSITÄT LEOBEN, Leoben (AT)

(72) Inventors: Thomas Griesser, St. Peter Freienstein (AT); Krzysztof Konrad Krawczyk, Weiz (AT)

(73) Assignee: MONTANUNIVERSITÄT LEOBEN, Leoben (AT)

( * ) Notice: Subject to any disclaimer, the term of this patent is extended or adjusted under 35 U.S.C. 154(b) by 976 days.

(21) Appl. No.: 17/634,199

(22) PCT Filed: Aug. 10, 2020

(86) PCT No.: PCT/EP2020/072404

§ 371 (c)(1),
(2) Date: Feb. 9, 2022

(87) PCT Pub. No.: WO2021/028394

PCT Pub. Date: Feb. 18, 2021

(65) Prior Publication Data

US 2022/0298374 A1 Sep. 22, 2022

(30) Foreign Application Priority Data

Aug. 12, 2019 (GB) ..................................... 1911512

(51) Int. Cl.
*C09D 11/00* (2014.01)
*C09D 11/52* (2014.01)
*H05K 3/12* (2006.01)
*G06F 1/16* (2006.01)

(52) U.S. Cl.
CPC ............. *C09D 11/52* (2013.01); *H05K 3/125* (2013.01); *H05K 3/1283* (2013.01); *G06F 1/163* (2013.01); *G06F 1/1652* (2013.01); *H05K 2203/10* (2013.01)

(58) Field of Classification Search
CPC ...... C09D 11/52; H05K 3/125; H05K 3/1283; H05K 2203/10; G06F 1/163; G06F 1/1652
USPC .............................. 106/31.01, 31.13, 31.92
See application file for complete search history.

(56) References Cited

U.S. PATENT DOCUMENTS

| | | | |
|---|---|---|---|
| 2,630,444 A | 3/1953 | Fugassi et al. | |
| 2004/0026258 A1 | 2/2004 | Ho et al. | |
| 2006/0130700 A1 | 6/2006 | Reinartz | |
| 2009/0120800 A1 | 5/2009 | Chung et al. | |
| 2010/0037731 A1 | 2/2010 | Li | |
| 2010/0247870 A1 | 9/2010 | Suzuki et al. | |
| 2011/0011772 A1* | 1/2011 | Schmidt | B01J 37/0225 |
| | | | 208/254 R |
| 2011/0059234 A1 | 3/2011 | Byun et al. | |
| 2011/0232527 A1 | 9/2011 | Kang et al. | |
| 2016/0168714 A1* | 6/2016 | Shukla | C23C 18/1637 |
| | | | 204/157.4 |
| 2018/0376593 A1 | 12/2018 | Kim et al. | |

FOREIGN PATENT DOCUMENTS

| | | |
|---|---|---|
| CN | 105419488 A | 3/2016 |
| CN | 109246920 A | 1/2019 |
| CN | 109401440 A | 3/2019 |
| DE | 102005038208 A1 | 2/2007 |
| EP | 2156911 A1 | 2/2010 |
| EP | 3127969 A1 | 2/2017 |
| KR | 100759251 B1 | 9/2007 |
| KR | 20150077676 A | 7/2015 |
| KR | 20150114603 A | 10/2015 |
| KR | 20160077412 A | 7/2016 |

(Continued)

OTHER PUBLICATIONS

Hwang, B. et. al.: "Transparent Stretchable Self-Powered Patchable Sensor Platform with Ultrasensitive Recognition of Human Activities" ACS Nano (2015).

(Continued)

*Primary Examiner* — James E McDonough

(74) *Attorney, Agent, or Firm* — Womble Bond Dickinson (US) LLP

(57) ABSTRACT

The present invention relates to an ink composition, a kit comprising components of the ink composition, a method of manufacturing a deformable conductor utilizing the ink composition, a deformable conductor obtainable by the method, an electronic device, in particular a wearable and/or stretchable electronic device, comprising the deformable conductor, a method of manufactuing a conductor, a conductor obtainable by the method and an electronic device comprising the conductor. The ink composition comprises a source of transition metal ions, a reducing agent and a polymer and/or a polymer precursor, the polymer precursor comprising a polymerizable terminal multiple bond. The method of manufacturing a deformable conductor comprises the steps of applying the ink composition on at least a part of a surface of a deformable substrate and thermally treating and/or irradiating the ink composition.

7 Claims, No Drawings

(56) References Cited

FOREIGN PATENT DOCUMENTS

| KR | 101785617 B1 | 10/2017 |
| WO | 2003106573 A1 | 12/2003 |
| WO | 2011126706 A2 | 10/2011 |
| WO | 2013036519 A1 | 3/2013 |
| WO | 2013096664 A1 | 6/2013 |
| WO | 2016096719 A1 | 6/2016 |
| WO | 2016170160 A1 | 10/2016 |
| WO | 2018169672 A1 | 9/2018 |
| WO | 2019020682 A1 | 1/2019 |

OTHER PUBLICATIONS

Park, M. et. al.: "Metal nanowire percolation micro-grids embedded in elastomers for Stretchable and Transparent conductors"; Journal of Materials Chemistry (2015) 3; pp. 8241-8247.
Martinez, V. et. al.: "Stretchable Silver nanowire-elastomers composite microelectrodes with tailored electrical properties"; ACS Applied Materials & Interfaces (2015); pp. 13467-13475.
Yu, Y. et. al.: "Three-Dimensional Compressible and Stretchable Conductive composites"; Advanced Materials (2014) 26; pp. 810-815.
Liang, J. et.al.: "Highly Conductive and Stretchable conductors fabricated from bacterial cellulose"; NPG Asia Materials (2012) 4.
Yan, C. et. al.: "Highly stretchable Piezoresistive Graphene-Nanocellulose Nanopaper for Strain Sensors"; Advanced Materials (2014) 26; pp. 2022-2027.
Vural, M. et. al.: "Sprayable Elastic conductors based on block Copolymer Silver Nanoparticle Composites"; ACS Nano (2015) 9, 1; pp. 336-344.
Hu, M. et. al.: "Direct Pen Writing of Adhesive Particle-Free Ultrahigh Silver Salt-Loaded Composite Ink for stretchable circuits"; ACS Nano (2016) 10; pp. 396-404.
Guo, C. et. al.: "Fatigue-free, superstretchable, transparent, and biocompatible metal electrodes"; 2015; pp. 1-6.
Jeong, G. et. al.: "Solderable and electroplatable flexible electronic circuit and porous stretchable elastomer"; Nature communications (2012) 3:977; pp. 1-8.
Jung, E. et. al.: "Highly Efficient Flexible Optoelectronic Devices using metal nanowire-conducting polymer composite Transparent electrode"; Electron. Mater. Lett. (2015), 11, 5; pp. 906-914.
Chen, S. et. al.: "Fabrication of Nanoscale circuits on Inkjet-Printing Patterned Substrates"; Advanced Materials (2015) 27; pp. 3928-3933.
Ahn, B. et. al.: "Omnidirectional Printing of Flexible, Stretchable, and Spanning Silver Microelectrodes"; Science (2009) 323; pp. 1590-1593.
Sureshkumar, M. et. al.: "Conductive Nanocomposites Based on Polystyrene Microspheres and Silver Nanowires by Latex Blending"; ACS Applied Materials & Interfaces (2015) 7 ; pp. 756-764.
International Preliminary Report for PCT/EP2020/072404, dated Feb. 25, 2022.
Hirsch, A. et. al.: "Intrinsically stretchable biphasic (solid-liquid) thin metal films"; Advanced Materials (2016) 28; pp. 4507-4512.
Sekitani, T. et al.: "Stretchable, Large-area Organic Electronics"; Advanced Materials (2010) 22; pp. 2228-2246.
Park, M. et. al.: "Design of conductive composite elastomers for stretchable electronics"; Nano Today (2014) 9; pp. 244-260.
Hammock, M. et. al.: "The Evolution of Electronic Skin (E-Skin): A Brief History, Design Considerations, and Recent Progress"; Advanced Materials (2013) 25; pp. 5997-6038.
Tegin, J. et. al.: "Tactile sensing in intelligent robotic manipulation—a review"; Industrial Robot: An International Journal (2005) 32/1; pp. 64-70.
Schwartz, G. et. al.: "Flexible polymer transistors with high pressure sensitivity for application in electronic skin and health monitoring"; Nature communications (2013) 4:1859; pp. 1-8.
Kim, D. et. al.: "Epidermal Electronics"; Science (2011) 333; pp. 838-843.

Kaltenbrunner, M. et. al.: "An ultra-lightweight design for imperceptible plastic electronics"; Nature (2013) 499; pp. 458-465.
Xue, P. et. al.: "Wearable electronics and photonics"; The Textile Institute (2007); pp. 81-103.
Gasana, E. et. al.: "Electroconductive textile structures through electroless deposition of polypyrrole and copper at polyaramide surfaces"; Surface & Coatings Technology (2006) 201; pp. 3547-3551.
Banaszczyk, J. et. al.: "Current Distribution Modelling in Electroconductive Fabrics"; Fibres & Textiles in Eastern Europe (2009) vol. 17, No. 2 (73); pp. 28-33.
Ehrmann, A. et. al.: "Intelligent umgarnt"; Physik unserer Zeit (Jun. 2010) 41; pp. 282-286.
Yeo, W. et. al.: "Multifunctional Epidermal Electronics Printed Directly Onto the Skin"; Advanced Materials (2013) 25; pp. 2773-2778.
Pang, C. et. al.: "A flexible and highly sensitive strain-gauge sensor using reversible interlocking of nanofibres"; Nature Materials (2012) 11; pp. 1-7.
Kim, D. et. al.: "Stretchable and Foldable Silicon Integrated Circuits"; Science (2008) 320; pp. 507-511.
Park, M. et. al.: "Highly stretchable electric circuits from a composite material of silver nanoparticles and elastomeric fibres"; Nature Nanotechnology (2012) 7; pp. 803-809.
Liang, J. et.al.: "Elastomeric polymer light-emitting devices and displays"; Nature Photonics (2013) 7, pp. 1-8.
Park, J. et. al.: "Three-dimensional nanonetworks for giant stretchability in dielectrics and conductors"; Nature Communications (2012) 3:916; pp. 1-8.
Sekitani, T. et al.: "A Rubberlike Stretchable Active Matrix Using Elastic Conductors"; Science (2008) 321; pp. 1468-1472.
Sekitani, T. et. al.: "Stretchable active-matrix organic light-emitting diode display using printable elastic conductors"; Nature Materials (2009) 8; pp. 494-499.
Nikolaus M. et al.: "Electrical conductivity and Young's modulus of flexible nanocomposites made by metal-ion implantation of polydimethylsiloxane: The relationship between nanostructure and macroscopic properties"; H.R. Shea, Acta Materialia (2011) 59; pp. 830-840.
Meldrum, A. et. al.: "Nanocomposite Materials Formed by Ion Implantation"; Advanced Materials (2001) 13, No. 19; pp. 1431-1444.
Zhu, S. et. al.: "Ultrastretchable Fibers with Metallic Conductivity Using a Liquid Metal Alloy Core"; Advanced Functional Materials (2013) 23; pp. 2308-2314.
Kubo, M. et. al.: "Stretchable Microfluidic Radiofrequency Antennas"; Advanced Materials (2010) 22; pp. 2749-2752.
Chiechi, R. et. al.: "Eutectic Gallium-Indium (EGaIn): A Moldable Liquid Metal for Electrical Characterization of Self-Assembled Monolayers"; Angewandte Chemie Int. Ed. (2008) 47, pp. 142-144.
Niu, X. et. al.: "Characterizing and Patterning of PDMS-Based Conducting Composites"; Advanced Materials (2007) 19; pp. 2682-2686.
Denver, H. et. al.: "Fabrication of polydimethylsiloxane composites with nickel nanoparticle and nanowire fillers and study of their mechanical and magnetic properties"; Journal of Applied Physics (2009) 106, 064909.
Chun, K. et. al.: "Highly conductive, printable and stretchable composite films of carbon nanotubes and silver"; Nature Nanotechnology (2010) 5; pp. 853-857.
Xu, F. et. al.: "Highly Conductive and Stretchable Silver Nanowire Conductors"; Advanced Materials (2012).
Hyun, D. et. al.: "Ordered Zigzag Stripes of Polymer Gel/Metal Nanoparticle Composites for Highly Stretchable Conductive Electrodes"; Advanced Materials (2011) 23, pp. 2946-2950.
Urdaneta, M. et. al.: "Stretchable Electrodes with High Conductivity and Photo-Patternability"; Advanced Materials (2007) 19; pp. 2629-2633.
Lipomi, D. et. al.: "Skin-like pressure and strain sensors based on transparent elastic films of carbon nanotubes"; Nature Nanotechnology (2011) 6; pp. 788-792.

(56) References Cited

OTHER PUBLICATIONS

Tee, B. et. al.: "An electrically and mechanically self-healing composite with pressure- and flexion-sensitive properties for electronic skin applications"; Nature Nanotechnology (2012) 7; pp. 825-832.

Yin, H. et. al.: "Innovative elastic and flexible conductive PEDOT:PSS composite films prepared by introducing soft latexes"; Journal of Materials Chemistry (2012) 22; pp. 3800-3810.

Zhan, Y. et al.: "Enhancing electrical conductivity of rubber composites by constructing interconnected network of self-assembled graphene with latex mixing"; Journal of Materials Chemistry (2012) 22; pp. 10464-10468.

Bandodkar A. et. al.: "All-Printed Stretchable Electrochemical Devices"; Advanced Materials (2015) 27; pp. 1-6.

Lipomi, D. et. al.: "Electronic Properties of Transparent Conductive Films of PEDOT:PSS on stretchable Substrates"; Chemistry of Materials (2012) 24; pp. 373-382.

Vosgueritchian, M. et. al.: "Highly Conductive and Transparent PEDOT:PSS Film with Fluorosurfactant for Stretchable and Flexible Transparent Electrodes"; Advanced Functional Materials (2012) 22; pp. 421-428.

Oh, J. et. al.: "Conducting Polymer Dough for Deformable Electronics"; Advanced Materials (2016) 28; pp. 4455-4461.

Ma, R. et. al.: "Extraordinarily High Conductivity of Stretchable Fibers of Polyurethane and Silver Nanoflowers"; ACS Nano (2015) 9, 11; pp. 10876-10886.

Kim, D. et. al.: "Highly Stable and Tunable n-Type Graphene Field-Effect Transistors with Poly(vinyl alcohol) Films"; ACS Applied Materials & Interfaces (2015); pp. 1-7.

* cited by examiner

INK COMPOSITION, KIT, METHOD OF MANUFACTURING A DEFORMABLE CONDUCTOR UTILIZING THE INK COMPOSITION, DEFORMABLE CONDUCTOR, ELECTRONIC DEVICE COMPRISING THE DEFORMABLE CONDUCTOR, METHOD OF MANUFACTURING A CONDUCTOR, CONDUCTOR AND ELECTRONIC DEVICE COMPRISING THE CONDUCTOR

CROSS-REFERENCE TO RELATED APPLICATIONS

The present application is a U.S. national phase of International Application No. PCT/EP2020/072404 filed 10 Aug. 2020 which designated the U.S. and claims priority to British Patent Application No. 1911512.0 filed 12 Aug. 2019, the entire contents of each of which are hereby incorporated herein by reference.

FIELD OF THE INVENTION

The present invention relates to an ink composition, a kit comprising components of the ink composition, a method of manufacturing a deformable conductor utilizing the ink composition, a deformable conductor obtainable by the method, an electronic device, in particular a wearable and/or stretchable electronic device, comprising the deformable conductor, a method of manufacturing a conductor, a conductor obtainable by the method and an electronic device comprising the conductor.

BACKGROUND

The field of flexible or elastic electronics has rapidly grown over the past decade as a result of the increasing demand for real-time health monitoring, light weight mobile electronics, wearable displays etc. In the proximate future multifunctional electronic devices are going to be incorporated on the human body or clothing and a stable performance under conditions of high strain and extreme body motion such as folding, twisting and stretching will be required. The growing demand for such devices has triggered research in the design and manufacturing of stretchable elastomers and elastomer composites. Although good conductivity and high stretchability seem to be mutually exclusive features, a few approaches to combine stretchability and good electrical conductivity have been proposed to date.

A common strategy is to obtain stretchable conductors from stiff, non-stretchable materials: (a) coiled metal wires, (b) meanders of metal foil, (c) thin layers of metal sputtered on prestretched or buckled/microporous substrates. These interconnects are stretchable within the boundaries imposed by geometrical features of the conductive film due to the microporosity of the surface, pattern design (e.g. meanders), pre-stretching and/or grain boundary lithography. Within these limits, excellent conductivity, speed and only little fatigue are observed. Nevertheless, above critical strain values (i.e. approx. 40% for meanders) irreversible destruction of the circuitry occurs. Additionally, the fabrication of conductive layers on prestretched substrates poses some technical challenges, which significantly increase the cost of manufacturing.

Liquid metal conductors on elastomers show optimal $R/R_0$ at almost any strain values but are difficult to manufacture industrially. In a recent publication (Hirsch, A., Michaud, H. O., Gerratt, A. P., Mulatier, S. de & Lacour, S. P. Intrinsically stretchable biphasic (solid-liquid) thin metal films. Advanced Materials 28, 4507-4512 (2016)), a thin layer of noble metal (i.e. Au) was evaporated onto an elastomer surface, followed by the evaporation of a layer of Ga. This resulted in a biphasic $AuGa_2$/Ga layer, which showed excellent conductivity and was virtually fatigue free. The practical applicability for large-scale production is however limited by the thermal evaporation steps, which require high vacuum.

High stretchability with low $R/R_0$ was reported for stretchable inks based on PEDOT:PSS. The conductive polymer is typically used together with a fluorosurfactant and can be applied via screen printing. The advantage of the system lies inter alia in high optical transparency, which makes it a stretchable analogue to ITO films. However, for applications in stretchable interconnects, the limited conductivity of PEDOT:PSS is a disadvantage.

Well resolved stretchable interconnects were manufactured by infiltration of an elastomeric substrate with $Ag^+$ ions, followed by chemical reduction. In this approach, the high solubility of silver trifluoroacetate in organic solvents was exploited. The reduction is carried out by means of hydrazine or formaldehyde treatment. These substances are toxic or require a harsh environment, so the produced stretchable wiring boards need to be extensively rinsed. The preparation requires a multistep procedure and works well only on selected substrates, which limits its applicability in industrial processes.

Despite the advantages of the systems described above, the vast majority of stretchable conductive systems are based on conductive composites, in which the polymeric part is responsible for the stretchability, while percolated conductive fillers allow efficient charge transfer. Conductive fillers may be carbon based (e.g. graphite, amorphous carbon, carbon nanotubes (CNTs), graphene, pyrolyzed bacterial cellulose) or metallic (e.g. metal nanowires, microflakes, micropowders, microflowers and nanoparticles). Combinations of different kinds of fillers were also reported.

One method of fabricating conductive composites is the infiltration of a percolated filler-network with a liquid elastomer resin, which is subsequently cured. Thus obtained composites show excellent conductivity, since the filler network is per se highly percolated. The drawback is the relatively complex, multistep manufacturing process and the difficulty in the precise deposition of the filler.

In another approach, an ink contains both the elastomeric resin and the filler in a single component, which can be structured for instance by means of screen printing. The latter is the preferred deposition method for industrial applications because of the simplicity of the printing process, easy automatization, applicability on different substrates and good resolution. Common inks giving access to conductive stretchable composites comprise CNTs and/or microscopic metallic particles. Particularly good conductivities under strain can be achieved with silver microflakes, which are the filler of choice in most commercially available systems. These inks result in percolated networks with excellent conductivity, but the inks have generally high $R/R_0$ values and low fatigue resistance, since many connections between individual filler nanoparticles are broken when strain is applied. The particles of the filler may also undergo encapsulation in the insulating polymer, which decreases the effective percolation. Thus, relatively thick layers of the composite are necessary to meet the required conductivity and fatigue resistance.

Also electronics or substrates that are not repeatedly stretched, but rather deformed, stretched, flexed or re-melted only once, are of interest. Examples of such processes include A) Thermoforming, i.e. hot pressing of a planar printed wiring board, leading to permanent 3D structuring of the substrate, which may involve stretching (a few %), bending, flexing and re-melting of the substrate; B) Thermoshrinking (similar to A); C) Enveloping, such as e.g. in the case of enveloping a solid object with natural or synthetic leather, which involves heating and prestretching the substrate onto a solid object and fixing it in such state. Although the strains are generally quite low and there is substantially only one, or few stretching cycles, the stretchability, plasticity or deformability of a conductor may be of crucial benefit in these cases as well.

OBJECTS OF THE INVENTION

The present invention aims at overcoming the above described problems and drawbacks. Thus, an object of the present invention is to provide a method which enables the manufacturing of a deformable (such as an elastic, flexible, stretchable and/or plastic) conductor exhibiting high stretchability along with excellent electrical conductivity (preserved even at high strain values) and excellent fatigue resistance (e.g. only minimum changes in conductivity after multiple stretching and release cycles) in a cost efficient manner and suitable for high throughput manufacturing. In addition, an object of the present invention is to provide an ink composition that can be utilized in such a method, in particular which may be applied by printing. Another object of the present invention is to provide a method for manufacturing a conductor in a very cost-efficient manner.

SUMMARY OF THE INVENTION

The present inventors have made diligent studies for solving these objects and have found that an ink comprising a source of transition metal ions, a reducing agent or a reducing species, and a dissolved polymer or a polymerizable polymer precursor, in particular a monomer, may undergo upon thermal treatment in situ a reduction of the transition metal ions and a polymerization reaction (in case of a polymerizable polymer precursor) resulting in the formation of a percolated network of metal nano- or microstructure or of metal nanoparticles embedded (in particular homogenously dispersed) in a polymer matrix (of a previously dissolved polymer or, in case of a polymerizable polymer precursor, of the polymer formed upon polymerization). Without wishing to be bound by any theory, the inventors assume that upon thermal treatment any stabilising ligands of the transition metal ions may evaporate so that an unstable complex or salt of the transition metal ions with the reducing agent may be generated, which may be self-reducing and may thus further decompose to form a percolated network of metal nano- or microstructure. The inventors further assume that temporally parallel or slightly offset to the decomposition process, in which the metal nano- and/or microstructure are formed, polymerization may take place in such a manner that the space between those metallic structures is filled by the polymer, thereby forming a polymer network which binds ("glues") these metallic structures together. Similarly, in case of a dissolved polymer, it may also fill the space between those metallic structures. As a result, a composite material, which may also be denoted as "in-situ nanocomposite" (ISNC), may be obtained which exhibits electrical conductivity (in view of the metallic structure or nanoparticles) as well as deformability, such as elasticity, flexibility, stretchability or plasticity, (in view of the polymer matrix) and which may thus also be referred to as a plastic or elastic conductor. In particular, the inventors have found that the electrical conductivity of thus obtained ISNCs may be preserved even at high strain values (for instance may be stretchable up to 200% with very low relative resistance ratio, defined as $R/R_0$, where R and $R_0$ are the values of resistance at a given strain level and the resistance at 0% strain, respectively), but decreases monotonically during the stretching process. After release, the conductivity may return to the original value and only little change could be observed after multiple stretching and release cycles (i.e. indicating a high fatigue resistance). In addition, the composite material may firmly adhere to the surface of the deformable substrate after the thermal treatment.

Accordingly, the present invention relates to an ink composition comprising a source of transition metal ions, a reducing agent/reducing species (suitable/configured for reducing the transition metal ions, in particular under specific conditions, such as in the absence of a solvent and/or upon heating), and a polymer (in particular a suspended, dissolved or soluble polymer) and/or a polymer precursor, the polymer precursor comprising a (in particular radically) polymerizable terminal multiple bond.

The components of the ink composition as described herein may be in particular provided in a spatially separated manner, for instance in a kit, in particular a kit-of-parts. In particular, it may be advantageous if the reducing agent is kept separately from the other components of the ink composition, such as the source of transition metal ions and the polymer and/or the polymer precursor.

Thus, the present invention also relates to a kit comprising:

a source of transition metal ions;
a reducing agent;
a polymer and/or a polymer precursor, the polymer precursor comprising a polymerizable terminal multiple bond.

Furthermore, the present invention relates to the use of the kit as described herein for preparing an ink composition, in particular an ink composition as described herein.

The present invention further relates to a method of manufacturing a deformable conductor (composite material, in particular in-situ nanocomposites (ISNCs), the method comprising the steps of (a) applying an ink composition as described herein on at least a part of a surface of a deformable substrate (such as an elastomer substrate), and (b) thermally treating and/or irradiating the ink composition.

In addition, the present invention relates to a deformable (such as elastic, flexible, stretchable, plastic) conductor (e.g. conductive trace, composite material, ISNC) obtainable by the method as described herein.

Moreover, the present invention relates to an electronic device, in particular a wearable and/or stretchable electronic device, comprising the deformable (such as elastic, flexible, stretchable, plastic) conductor as described herein.

Still further, the present invention relates to a method of manufacturing a conductor, the method comprising the steps of (a) applying an ink composition comprising a source of transition metal ions and a reducing agent on at least a part of a surface of a substrate, and (b) thermally treating the ink composition by means of near infrared (NIR) irradiation and/or irradiating the ink composition with near infrared radiation, as well as to a conductor obtainable by such method and an electronic device comprising such conductor.

Other objects and many of the attendant advantages of embodiments of the present invention will be readily appreciated and become better understood by reference to the following detailed description of embodiments.

DETAILED DESCRIPTION OF THE INVENTION

Hereinafter, details of the present invention and other features and advantages thereof will be described. However, the present invention is not limited to the following specific descriptions, but they are for illustrative purposes only.

It should be noted that features described in connection with one exemplary embodiment or exemplary aspect may be combined with any other exemplary embodiment or exemplary aspect, in particular features described with any exemplary embodiment of the ink composition may be combined with any exemplary embodiment of a kit or a use thereof, with any exemplary embodiment of a method of manufacturing a deformable conductor, with any exemplary embodiment of a deformable conductor, with any exemplary embodiment of a method of manufacturing a conductor, with any exemplary embodiment of a conductor or with any exemplary embodiment of an electronic device and vice versa, unless specifically stated otherwise.

Where an indefinite or definite article is used when referring to a singular term, such as "a", "an" or "the", a plural of that term is also included and vice versa, unless specifically stated otherwise, whereas the word "one" or the number "1", as used herein, typically means "just one" or "exactly one".

The expressions "comprising", "including" or "containing" do not exclude other elements or steps and, as used herein, include not only the meaning of "comprising", "including" or "containing", but may also encompass "consisting essentially of" and "consisting of".

Unless specifically stated otherwise, the expression "at least partially", "at least a partial" or "at least a part of", as used herein, may mean at least 5% thereof, in particular at least 10% thereof, in particular at least 15% thereof, in particular at least 20% thereof, in particular at least 25% thereof, in particular at least 30% thereof, in particular at least 35% thereof, in particular at least 40% thereof, in particular at least 45% thereof, in particular at least 50% thereof, in particular at least 55% thereof, in particular at least 60% thereof, in particular at least 65% thereof, in particular at least 70% thereof, in particular at least 75% thereof, in particular at least 80% thereof, in particular at least 85% thereof, in particular at least 90% thereof, in particular at least 95% thereof, in particular at least 98% thereof, and may also mean 100% thereof.

The term "deformable", as used herein, may in particular denote the capability of a material of being reshaped. In an embodiment, the term "deformable" may in particular include a reversible and/or repetitive deformation, which may also be characterized by the terms "elastic", flexible" and/or "stretchable". In an alternative embodiment, the term "deformable" may include an irreversible and/or single deformation, which may also be characterized by the term "plastic". The terms "elastic", "flexible" and "stretchable" are substantially interchangeable herein and may particularly denote a material property of reversibly deforming under stress, while generally the term "plastic" denotes a material property of irreversibly deforming under stress, i.e. it does generally not revert to its original shape upon release of the stress.

The term "conductor", as used herein, may in particular denote a material that is capable of conducting electric current, i.e. that is electrically conductive. A conductor within the meaning of the present invention may be capable of conducting electric current even under strain, such as under tensile strain or stress and/or under a flexural load, and preferably may substantially revert to its initial conductivity after release of the strain. In an embodiment, a conductor as well as its conductivity may be substantially fatigue resistant with regard to repeated appliances of stress/strain and release thereof. The conductor may for instance represent a conductive trace, such as a conductive trace formed or arranged on a substrate, such as a deformable substrate. The (deformable) conductor within the meaning of the present invention may in particular represent a composite material, which may also be denoted as "in-situ nanocomposite" (ISNC).

In a first aspect, the present invention relates to an ink composition comprising a source of transition metal ions, a reducing agent (suitable/configured for reducing the transition metal ions), and a (dissolved or soluble) polymer and/or a polymer precursor, the polymer precursor comprising a (in particular radically) polymerizable terminal multiple bond.

The term "transition metal", as used herein, may in particular denote an element whose atom has a partially filled d sub-shell, or which can give rise to cations with an incomplete d sub-shell. Examples for transition metals include nickel, palladium, copper or silver. Of these, copper and silver may be particularly suitable for solving the objects of the present invention in view of their excellent electrical conductivity. Thus, in an embodiment, the transition metal comprises at least one of silver and copper.

In an embodiment, the source of transition metal ions comprises a transition metal salt (i.e. a compound comprising transition metal cations and anions in a salt-like ionic structure), a transition metal oxide (i.e. a compound of transition metal (ions) with oxygen, which compound may be ionic or at least highly polar) and/or a transition metal complex (i.e. a compound of transition metal (ions) at least partially surrounded by ligands or complexing agents). As will be appreciated by a person skilled in the art, the transition metal ions may be present in the ink composition in a variety of forms, which all have in common that they may release or provide transition metal ions and thus may represent a source (or reservoir) of transition metal ions.

In an embodiment, the ink composition comprises from 5 to 50 wt.-% of the source of transition metal ions. For instance, the source of transition metal ions may be contained in an amount of from 6 to 40 wt.-%, such as from 7 to 35 wt.-%, such as from 8 to 30 wt.-%, such as from 9 to 25 wt.-%, such as from 10 to 20 wt.-%, such as from 12.5 to 17.5 wt.-% or from 15 wt.-% to 20 wt.-%, based on the total weight of the ink composition.

In an embodiment, the reducing agent is capable or configured for reducing the transition metal ions, i.e. for donating one or more electrons to a transition metal ion. In particular, the reducing agent may be capable or configured for reducing silver ions ($Ag^+$) to elemental silver (Ag) and/or copper ions ($Cu^{2+}$ or $Cu^+$) to elemental copper (Cu).

In an embodiment, the reducing agent is selected from the group consisting of formate, carbamate, carboxylate, ammonium carbonate, amine carbonate, ammonium bicarbonate, amine bicarbonate, hydrazinecarboxylate and combinations thereof. In particular, the reducing agent may comprise formate, i.e. a salt of formic acid, which has proven to be a particularly suitable reducing agent for solving the objects of the present invention. Similarly, the reducing agent may comprise a carbamate or a combination of formate and a carbamate. By taking this measure, a highly unstable formate or carbamate salt or complex of the transition metal ions, such as copper or silver, may be formed, which may be self-reducing and may decompose under heat treatment to form a percolated network of metal nano- or microstructure. Moreover, upon acting as a reducing agent, formate becomes oxidized to carbon dioxide and carbon monoxide, which are gaseous and can therefore easily be removed from the forming metal structure of the deformable conductor.

In an embodiment, the ink composition comprises from 1 to 10 wt.-% of the reducing agent. For instance, the reducing agent may be contained in an amount of from 2 to 9 wt.-%, such as from 2.5 to 8 wt.-%, such as from 3 to 7.5 wt.-%, such as from 3.5 to 7 wt.-%, such as from 4 to 6 wt.-%, in particular about 5 wt.-%, based on the total weight of the ink composition.

In an embodiment, the ink composition comprises the reducing agent in an amount that equals to or is greater than the molar equivalence of the transition metal ion. For instance, in case of $Cu^{2+}$ as the transition metal ion, the amount or molar equivalence of the reducing agent in the ink composition is preferably at least 2 mol per 1 mol of transition metal ion. In case of $Ag^+$ as the transition metal ion, the amount or molar equivalence of the reducing agent in the ink composition is preferably at least 1 mol per 1 mol of transition metal ion.

In an embodiment, the polymer comprises a thermoplast or an elastomer, for instance selected from the group consisting of polyurethanes, polyethyleneglycol (PEG), polyester, such as polyethylene terephthalate (PET), polyethylene naphthalate (PEN), polycarbonate (PC); polysulfones, such as polyethersulfone (PES); polyarylates (PAR); polycyclic olefins (PCO); polyimides (PI); polyolefins, such as polyethylene (PE), polypropylene (PP); vinyl polymers, such as polystyrene (PS), polyvinyl chloride (PVC), polymethyl methacrylate (PMMA); polyamides; polyethers; polyketones, such as aromatic polyetherketones (e.g. PEEK); polysulfides (e.g. PPS); fluoropolymers, such as polyvinylidene fluoride (P(VDF), such as P(VDF-TrFE), which may be particularly suitable when used for a piezoelectric sensor), polytetrafluoroethylene (such as PTFE), fluorinated ethylene propylene (FEP); liquid crystal polymers; polyepoxides; polysiloxanes (e.g. PDMS); rubber materials, such as natural rubber (NR), synthetic natural rubber (IR), nitrile butadiene rubber (NBR), carboxylated nitrile butadiene rubber (XNBR), styrene butadiene rubber (SBR) and other rubber materials derived from polymer dispersions and caoutchouc or synthetic rubber latexes; biopolymers or combinations, copolymers and/or blends thereof. In particular, the polymer may comprise a polyisoprene rubber. More specifically, the polymer may comprise a dissolved thermoplast or elastomer or a thermoplast or elastomer that is soluble or suspended in the ink composition.

In an embodiment, the polymer precursor comprises at least one of a monomer and an oligomer. In particular, the polymer precursor may comprise a polymerizable monomer and/or a polymerizable oligomer. The term "oligomer", as used herein, may in particular denote a polymer having at least one polymerizable terminal multiple bond, such as a double bond.

More specifically, the polymer precursor may comprise a hydrophilic (or water-soluble) monomer. By taking this measure, a homogenous distribution of the polymer precursor in the ink composition may be facilitated, in particular a homogenous solution may be achieved, because the ink composition may contain a certain amount of water as a solvent, which may increase the stability (and thus the shelf life) of the ink composition. As a result of a homogenous distribution of the polymer precursor in the ink composition, in particular as a homogenous solution, the applicability of the ink composition, for instance by means of printing, may be improved, in that for instance clogging of nozzles may be avoided. However, also hydrophobic or water-insoluble monomers may be used in a manner allowing a homogeneous distribution, for instance in embodiments where the reducing agent comprises a carbamate.

In an embodiment, the polymer precursor comprises a (meth)acrylate, i.e. an acrylate and/or a methacrylate, in particular an acrylate. By taking this measure, a rapid polymerization of the polymer precursor may be achieved.

In an embodiment, the polymer precursor is selected from the group consisting of (meth)acrylic acid, an acrylamide or a salt thereof. For instance, the polymer precursor may comprise at least one of 4-acryloyl morpholine (ACMO) and N-hydroxyethyl acrylamide. In particular ACMO, which exhibits a low toxicity and a good solubility in water, has proven to be particular suitable for solving the objects of the present invention. Moreover, the present inventors have found that the presence of an acrylate monomer, such as ACMO, in the ink composition may lead to an improved wetting of a substrate, such as a deformable substrate as used in a method of manufacturing a deformable conductor further exemplified below. In addition, the binding to the substrate, i.e. the substrate adhesion, may be improved when using an acrylate monomer, such as ACMO.

In an embodiment, the polymerizable terminal multiple bond comprises at least one of a carbon-carbon double bond and a carbon-carbon triple bond, in particular a carbon-carbon double bond.

In an embodiment, the ink composition comprises from 0.5 to 10 wt.-% of the polymer and/or polymer precursor. For instance, the polymer and/or polymer precursor may be contained in an amount of from 0.75 to 8 wt.-%, such as from 1 to 5 wt.-%, such as from 1.5 to 4 wt.-%, such as from 2 to 3 wt.-%, in particular from 2 to 2.5 wt.-%, based on the total weight of the ink composition.

In an embodiment, a weight ratio of the polymer and/or polymer precursor to the source of transition metal ions in the ink composition may be from 0.05:1 to 0.5:1, in particular from 0.07:1 to 0.4:1, in particular from 0.08:1 to 0.3:1, in particular from 0.1:1 to 0.25:1, in particular from 0.15:1 to 0.2:1. For instance, a weight ratio of ACMO:Ag of from 0.14:1 to 0.17:1 in the ink composition has proven particularly suitable for solving the objects of the present invention. It has turned out that higher concentrations of the polymer and/or polymer precursor may result in lower electrical conductivity, while lower contents may result in an impaired substrate wetting and/or poor electro-mechanical properties.

In an embodiment, the ink composition further comprises a polymerization initiator. The presence of a polymerization initiator in the ink composition may facilitate the initiation of the polymerization reaction of the polymer precursor. Thus, the presence of a polymerization initiator may increase the polymerization speed (velocity) and/or reduce the curing time. In particular, the polymerization initiator may comprise a thermal initiator and/or a photoinitiator.

Advantageously, the polymerization initiator comprises a thermal initiator. The term "thermal initiator", as used herein, may in particular denote a compound which can be activated by thermal energy, for instance upon directing thermal energy to the compound, such as by heating and/or by irradiation with electromagnetic radiation in the infrared wavelength region (such as the wavelength range of from 780 nm to 1 mm) and/or in the microwave wavelength region (such as the wavelength range of from 1 mm to 300 mm). Upon activation by thermal energy, the thermal initiator may be in particular converted into a radical thereof. Thus, the thermal initiator may be in particular a radical generating thermal initiator, which may also be referred to as a free radical thermal initiator. It might be advantageous if the polymerization initiator is a halogen-free thermal initiator or at least a thermal initiator that does not release halogen ions upon thermal treatment. A particular suitable thermal initiator for solving the objects of the present invention has proven to be 4,4'-azobis(4-cyanopentanoic acid), which may also be referred to as 4,4'-azobis(4-cyanovaleric acid) (ABCVA).

Additionally or alternatively, the polymerization initiator may comprise a photoinitiator. The term "photoinitiator", as used herein, may in particular denote a compound which can be activated by an energy-carrying activation beam (such as electromagnetic radiation), for instance upon irradiation therewith. Upon activation by an energy-carrying beam, the photoinitiator may be in particular converted into a radical thereof. Thus, the photoinitiator may be in particular a radical generating photoinitiator. The photoinitiator may be in particular a type I photoinitiator or a type II photoinitiator.

In an embodiment, the ink composition comprises from 0.1 to 0.5 wt.-% of the polymerization initiator. For instance, the polymerization initiator may be contained in an amount of from 0.15 to 0.4 wt.-%, such as from 0.2 to 0.3 wt.-%, in particular about 0.25 wt.-%, based on the total weight of the ink composition.

In an embodiment, the source of transition metal ions and the polymer and/or polymer precursor are represented by one compound. For example, silver acrylate may be used, which may represent both a source of transition metal ions and a polymer precursor.

In an embodiment, the ink composition further comprises a complexing agent, in particular a complexing agent suitable/configured for forming a complex with the transition metal ions. The term "complexing agent", as used herein, may in particular denote a compound which may be capable of acting as a ligand for a transition metal ion in a (transition metal ion)-(complexing agent)-complex. By taking this measure, the stability (such as the shelf life) of the ink composition may be increased. It may be advantageous if the complexing agent exhibits a volatility or vapor pressure such that it is little volatile upon storage of the ink composition (for instance at room temperature), but may easily evaporate upon thermal treatment so as to expose the transition metal ions and/or to enable the formation of an unstable or intermediate complex or salt of the transition metal ions with the reducing agent contained in the ink composition.

In an embodiment, the complexing agent is selected from the group consisting of ammonia, an alkyl amine or a salt thereof. Ammonia has proven to be a particular effective and little toxic complexing agent, which may additionally serve as a solvent of the ink composition. One drawback of ammonia is its relatively high volatility which may lead to a limited storage stability of the ink composition. An improved storage stability may be achieved by using an alkyl amine. In particular, a primary alkyl amine, i.e. an alkyl amine having a primary amine functional group ($-NH_2$), may be suitable, such as at least one of the group consisting of ethylenediamine, 1,3-diaminoproane, tert-butylamine, 2-amino-2-methyl-1-propanol or a salt thereof. Among these, tert-butylamine has proven to be a particularly suitable complexing agent. In particular, tert-butylamine exhibits a particularly appropriate volatility or vapor pressure such that it is little volatile upon storage of the ink composition (for instance at room temperature), but may easily evaporate upon thermal treatment so as to expose the transition metal ions and/or to enable the formation of an unstable or intermediate complex or salt of the transition metal ions with the reducing agent contained in the ink composition. In addition, in view of its bulky tert-butyl group and the resulting steric hindrance, its reactivity with regard to a polymerizable polymer precursor contained in the ink composition is very limited, for instance it exhibits little activity in Michael-type additions to acrylate double bonds (which may represent an undesired side reactions in other embodiments).

In an embodiment, the ink composition comprises from 10 to 60 wt.-% of the complexing agent. For instance, the complexing agent may be contained in an amount of from 15 to 50 wt.-%, such as from 20 to 40 wt.-%, based on the total weight of the ink composition. As will be discussed in further detail below, the complexing agent, such as ammonia and/or an alkyl amine, may also be used as a solvent in the composition. In that case, even higher amounts of for instance ammonia and/or the alkyl amine may be contained in the ink composition.

In an embodiment, the ink composition further comprises a viscosity-modifying agent, in particular an agent suitable/configured for increasing the viscosity of the ink composition. It might be advantageous if the ink composition has a viscosity of for instance from 250 to 750 mPa·s, such as from 400 to 600 mPa·s, in particular about 500 mPa·s, for instance if the ink composition is to be applied by a printing process, such as screen printing. Moreover, a relatively high viscosity may also be beneficial for reducing or even avoiding a premature evaporation of a complexing agent, such ammonia or an alkyl amine, if present. An appropriate viscosity may be obtained for instance by a high concentrated ink composition (i.e. having little or no solvent) and/or if the ink contains a polymer, in particular a dissolved polymer. Alternatively, in particular if the ink contains a polymer precursor comprising a polymerizable terminal multiple bond, such as a monomer, rather than a polymer, an appropriate viscosity may be obtained or adjusted by means of the addition of a viscosity-modifying agent, such as an (additional) polymeric additive. To this end, hydroxyethyl cellulose (HEC) has proven to be a particular suitable viscosity-modifying agent, for instance HEC having a weight-average molecular weight of from 100,000 to 1,500,000 g/mol. Further suitable viscosity-modifying agents include hydroxypropyl cellulose, carboxymethyl cellulose or other cellulose derivatives, derivatives of agar, starch and hyaluronic acid, other polymeric materials as well as combinations thereof. Alternatively or additionally, the viscosity of the ink composition may also be modified (in particular increased) by adding nanoparticles, such as nanoclays, layered silicates or silica particles. Alternatively or additionally, the viscosity of the ink composition may also be modified (in particular increased) by adding nanoparticles which may be chemically sinterable, as will be explained in further detail below.

In an embodiment, the ink composition comprises from 0.1 to 5 wt.-% of the viscosity-modifying agent. For instance, the viscosity-modifying agent may be contained in an amount of from 0.2 to 4 wt.-%, such as from 0.3 to 3 wt.-%, such as from 0.4 to 2 wt.-%, in particular from 0.5 to 1 wt.-% based on the total weight of the ink composition.

In an embodiment, the ink composition further comprises a carboxylic acid, in particular acetic acid and/or propionic acid, or a salt thereof (such as acetate). The present inventors have found that the stability of the ink composition, in particular its shelf life, may be increased if the ink composition further comprises a carboxylic acid or a salt thereof, in particular in a similar amount or molar equivalence as the reducing agent. Without wishing to be bound by any theory, the inventors assume that this increase in stability may be due to an increase in ionic strength of the ink composition, which in turn may suppress a crystallization of transition metal ions (stemming from the source of transition metal ions) with the reducing agent (in particular with anions from the reducing agent).

In an embodiment, the ink composition comprises from 1 to 10 wt.-% of the carboxylic acid or a salt thereof. For instance, a carboxylic acid or a salt thereof may be contained in an amount of from 2 to 9 wt.-%, such as from 2.5 to 8 wt.-%, such as from 3 to 7.5 wt.-%, such as from 3.5 to 7 wt.-%, such as from 4 to 6 wt.-%, in particular about 5 wt.-%, based on the total weight of the ink composition.

In an embodiment, the ink composition further comprises a surfactant or a similar additive that may modify surface tension, levelling, wetting or pinning the contact line or may act as a defoamer. By taking this measure, surface tension, levelling, wetting or pinning the contact line may be modified and foaming of the ink composition during its application, for instance by means of printing may be reduced. To this end, a polyether siloxane based defoamer, such as TEGO® Foamex 810 from Evonik Industries AG, as well as fluorosurfactants (such as from Chemours) have proven particularly suitable. Also a polyethylene glycol (PEG)-polydimethylsiloxane (PDMS) block copolymer, such as a PEG-PDMS-PEG triblock copolymer, may be added to the ink composition, which may improve the contact line of printed patterns and/or the wetting of the ink composition. For instance, the ink composition may comprise from 0.1 to 0.5 wt.-% of the surfactant or additive.

In an embodiment, the ink composition further comprises a solvent, such as a liquid or a mixture of liquids capable of dissolving the components of the ink composition, e.g. the source of transition metal ions, the reducing agent, the polymer and/or polymer precursor, the polymerization initiator (if any), the complexing agent (if any), the viscosity-modifying agent (if any), and the like.

In an embodiment, the solvent is selected from the group consisting of ammonia, an alkyl amine, water, an alcohol (in particular methanol, methoxypropanol, diethylene glycol methyl ether (2-(2-methoxyethoxy)ethanol), butanol or a diol, such as 1,2-propanediol), and mixtures thereof. As previously mentioned, the ink composition may contain water as a solvent, which may increase the stability (and thus the shelf life) of the ink composition. In particular, the presence of water may improve the stability of transition metal ion complexes. Moreover, as also previously mentioned, the ink composition may contain a complexing agent, such as ammonia and/or an alkyl amine, in excess, which may thus also serve as a solvent and which may be in particular suitable for solubilizing the source of transition metal ions. In particular, ammonia and/or tert-butylamine have proven particularly suitable solvents for the ink composition. In addition, the ink composition may contain an alcohol as a solvent, which may be particularly advantageous for dissolving the polymer and/or when using water-insoluble monomers.

In an embodiment, the solvent comprises a mixture of water and at least one of ammonia and an alkyl amine (in particular tert-butylamine) in a volume ratio of water to the at least one of ammonia and an alkyl amine of from 1:1.6 to 1:2.3, such as in a volume ratio of from 1:1.7 to 1:2.1, such as in a volume ratio of from 1:1.8 to 1:2, in particular in a volume ratio of about 1:1.9. By taking this measure, a relatively hydrophobic ink may be obtained capable of wetting a deformable substrate (as used for instance in a method of manufacturing a deformable conductor further exemplified below) without prior surface activation (such as by means of corona or ozone treatment). If a volume ratio of water to for instance tert-butylamine is lower than 1:2.3, crystals of the transition metal ions with the reducing agent may quickly form on the surface of an evaporating ink, which may limit the processing time due to clogging. A precipitation of crystals of the transition metal ions with the reducing agent before thermal treatment may also decrease the stretchability of the generated conductive composite. On the other hand, if a volume ratio of water to for instance tert-butylamine is higher than 1:1.6, a sufficient wetting of a deformable substrate (such as of a polyurethane substrate) may be impaired and may require prior surface activation.

In an embodiment, the ink composition is substantially free from particles. By taking this measure, an efficient and homogenous application of the ink composition with little or no clogging tendencies may be realized. With regard to embodiments being "substantially free from particles", particles, if any, may still be present in relatively minor amounts of up to 2, or up to 1 wt.-% based on the total weight of the ink composition.

In an alternative embodiment, the ink composition may additionally contain nanoparticles, e.g. in the form of silver microflakes, which may be embedded in the ink composition described herein and which may be chemically sinterable. Such inks may also be denoted "hybrid inks". Without wishing to be bound by any theory, the inventors assume that the reducing agent contained in the ink composition may act as a chemical sintering agent forming bridges or linkages between the nanoparticles. By taking this measure, thicker layers of the ink composition can be obtained by screen printing, which increases the overall conductance of the ink. As a further result, the viscosity of the ink composition may be increased. The term "nanoparticles", as used herein, typically include particles having an average particle diameter of from 10 nm to 20 μm, in particular from 50 nm to 10 μm, in particular from 100 nm to 5 μm, in particular from 500 nm to 2.5 μm. The determination of an average particle diameter is known to a person skilled in the art and can be performed for instance by visual microscopic observation with an appropriate magnification, for instance by using an electron microscope (such as a transmission electron microscope, TEM) and by randomly selecting an appropriate number of particles and calculating the average of the individual particle diameters. In particular, the ink composition may contain nanoparticles in an amount of from 1 to 90 wt.-%, such as from 5 to 70 wt.-%, based on the total weight of the ink composition.

In an embodiment, the reducing agent, the optional complexing agent and the optional solvent are volatile, i.e. are compounds having a high vapor pressure at room temperature or which can be (easily) evaporated upon thermal treatment. In particular, it might be advantageous if substantially any ingredients of the ink composition except for the transition metal and the polymer and/or polymer precursor are volatile. By taking this measure, a deformable conductor which deformability and/or which conductivity is not impaired by traces or residues from the applied ink and/or from the manufacturing process may be obtained.

In a second aspect, the present invention relates to a to a kit comprising:

a source of transition metal ions;

a reducing agent;

a polymer and/or a polymer precursor, the polymer precursor comprising a polymerizable terminal multiple bond.

The source of transition metal ions, the reducing agent, and the polymer and/or the polymer precursor may in particular be those as defined in detail above with regard to the ink composition according to the present invention. Further ingredients or components, as described in detail above with regard to the ink composition, may be comprised in the kit.

The components may be in particular provided in a spatially separated manner in the kit, in particular the kit-of-parts. In particular, the source of transition metal ions and the polymer and/or the polymer precursor on the one hand and the reducing agent on the other hand may be provided in separate compartments of the kit. It may be advantageous if the reducing agent is kept separately from the other components of the ink composition, such as the source of transition metal ions and the polymer and/or the polymer precursor, in order to avoid a premature reduction of transition metal ions. As a result, the storage stability (and thus the shelf life) may be increased.

Further ingredients or components, as described in detail above with regard to the ink composition, may be contained independently from each other in any one of the compartment of the source of transition metal ions and the polymer and/or the polymer precursor and/or the compartment of the reducing agent as well as in any additional compartment of the kit.

In particular, the kit may be a two-, three-, four-, five- or multi-component system, such as a 2K system, a 3K system, a 4K system, a 5K system and the like.

Prior to use, for instance in a method of manufacturing a deformable conductor, the components contained in separate compartments of the kit are mixed. The mixing may be carried out manually or (semi-)automatically by an appropriate device or dispenser. The components contained in separate compartments of the kit may be in particular mixed not more than 48 hours, not more than 24 hours, not more than 12 hours, not more than 6 hours, not more than 4 hours, not more than 3 hours, not more than 2 hours, not more than 90 minutes, not more than 60 minutes, not more than 45 minutes, not more than 30 minutes, not more than 25 minutes, not more than 20 minutes, not more than 15 minutes, not more than 10 minutes, not more than 7.5 minutes, not more than 5 minutes, not more than 4 minutes, not more than 3 minutes, not more than 2 minutes, not more than 90 seconds, not more than 60 seconds, not more than 45 seconds, not more than 30 seconds, not more than 25 seconds, not more than 20 seconds, not more than 15 seconds, not more than 10 seconds, not more than 7.5 seconds, not more than 5 seconds, not more than 4 seconds, not more than 3 seconds, not more than 2 seconds, not more than 1 second, prior to use, for instance in a method of manufacturing a deformable conductor.

Furthermore, the present invention relates to the use of the kit as described herein for preparing an ink composition, in particular an ink composition as described herein, which may be for instance suitable in a method of manufacturing a deformable conductor, as described in further detail below. For preparing the ink composition, the components contained in separate compartments of the kit may be mixed. The mixing may be carried out manually or (semi-)automatically by an appropriate device or dispenser.

In a third aspect, the present invention relates to a method of manufacturing a deformable conductor (composite material, in particular in-situ nanocomposite (ISNC), the method comprising the steps of (a) applying an ink composition according to the first aspect on at least a part of a surface of a deformable substrate (such as an elastomer substrate), and (b) thermally treating and/or irradiating (and thereby curing) the ink composition.

In an embodiment, the step (a) of applying an ink composition on at least a part of a surface of a deformable substrate comprises printing the ink composition on at least a part of a surface of a deformable substrate.

In an embodiment, the printing is selected from the group consisting of inkjet printing, screen printing, direct ink printing, e-jet printing (electrohydrodynamic jet (e-jet) printing), flexographic printing and gravure printing.

In an embodiment, the step (a) of applying an ink composition comprises (selectively) applying the ink composition on only a part of a surface of the deformable substrate. In particular, the ink composition may be applied in a patterned (structured) manner, such that a pattern of the ink composition is formed on the surface of the deformable substrate. Additionally or alternatively, the method may further comprise a step of structuring (patterning) the applied ink composition prior to step (b), in particular if the ink composition has been applied with a substantially continuous surface in step (a). Additionally or alternatively, the method may further comprise a step of structuring (patterning) the thermally treated and/or irradiated (cured) ink after step (b)). The step of structuring prior to step (b) and/or after step (b) may include at least one selected from the group consisting of cutting (such as laser cutting), selective wetting, etching or a (photo)lithography process.

In an embodiment, a thickness of the applied ink composition is from 5 μm to 200 μm, such as from 10 μm to 100 μm, in particular from 20 μm to 70 μm.

The material of the deformable substrate is not particularly limited, as long as it is deformable (such as elastic or plastic) and is capable of being wettable by an ink composition as described in the foregoing and/or capable of bearing the later formed composite material from the ink composition upon thermal treatment and/or irradiation on its surface. For instance, the material of the deformable substrate may comprise at least one polymer material, in particular at least one thermoplast or elastomer. Suitable examples of the material of the deformable substrate may be thermoplastics, thermosets and composite materials. In particular, suitable examples of the material of the deformable substrate include polyurethanes, polyurethane (meth)acrylates, PEG-(meth)acrylates; polyester, such as polyethylene terephthalate (PET), polyethylene naphthalate (PEN), polycarbonate (PC); polysulfones, such as polyethersulfone (PES); polyarylates (PAR); polycyclic olefins (PCO); polyimides (PI); polyolefins, such as polyethylene (PE), polypropylene (PP); vinyl polymers, such as polystyrene (PS), polyvinyl chloride (PVC), polymethyl methacrylate (PMMA); polyamides; polyethers; polyketones, such as aromatic polyetherketones (e.g. PEEK); polysulfides (e.g. PPS); fluoropolymers, such as polyvinylidene fluoride (P(VDF), such as P(VDF-TrFE), which may be particularly suitable when used for a piezoelectric sensor), polytetrafluoroethylene (such as PTFE), fluorinated ethylene propylene (FEP); liquid crystal polymers; polyepoxides; polysiloxanes (e.g. PDMS); rubber materials, such as natural rubber (NR), synthetic natural rubber (IR), nitrile butadiene rubber (NBR), carboxylated nitrile butadiene rubber (XNBR), styrene butadiene rubber (SBR) and other rubber materials derived from polymer dispersions and caoutchouc or synthetic rubber latexes; biopolymers or combinations, copolymers and/or blends thereof. In an embodiment, the material of the deformable substrate may be selected from the group consisting of polyisoprene rubber, polydimethylsiloxane (PDMS) and polyurethane, in particular thermoplastic polyurethane.

In an embodiment, the elastic substrate may have a tensile modulus (or Young modulus) of not more than 250 MPa, in particular of not more than 200 MPa. The lower limit of the tensile modulus of the elastomer substrate is not particularly limited, as long as the elastomer substrate is capable of bearing the later formed composite material from the ink composition upon thermal treatment and/or irradiation on its surface. In particular, the elastic substrate may have a tensile modulus of not less than 25 MPa, in particular of not less than 50 MPa. The tensile modulus of the elastomer substrate can be for instance determined in accordance with ISO 527-1 and 527-3.

It might be advantageous if the step (b) of thermally treating and/or irradiating the ink composition is carried out substantially immediately (i.e. without considerable interval or delay) after the step (a) of applying the ink composition on at least a part of a surface of a deformable substrate, so as to prevent an aging (in particular any premature reactions) of the ink composition before its thermal treatment and/or irradiation.

In an embodiment, the step (b) of thermally treating the ink composition comprises a treatment at (e.g. a heating to) a temperature of from 40° C. to 300° C., in particular 100° C. to 300° C., and for a period of time of from 5 min to 90 min, in particular from 10 min to 60 min. In some embodiments, in particular in case of silver-based ink compositions (i.e. if the ink composition comprises a source of transition metal ions, wherein the transition metal is silver), the heat treatment in step (b) may be carried at a temperature of from 80° C. to 150° C., in particular 100° C. to 130° C., and/or for a period of time of from 10 min to 90 min, in particular from 30 min to 60 min. In other embodiments, in particular in case of copper-based ink compositions (i.e. if the ink composition comprises a source of transition metal ions, wherein the transition metal is copper) and/or in case of silicone elastomer substrates (such as polydimethylsiloxane), the heat treatment in step (b) may be carried at a temperature of from 150° C. to 300° C., and/or for a period of time of from 5 min to 30 min. The afore-mentioned embodiments may in particular involve a heat treatment in an oven, such as a curing oven. In some embodiments, the time of thermal heat treatment may be even shorter, for instance if the heat is supplied by near infrared (NIR) irradiation. In some embodiments, the heat treatment may be performed under normal or inert (in particular oxygen-free) atmosphere. If the metal (present as the source of transition metal ions) is copper, it may be advantageous to perform the heat treatment under an inert gas atmosphere so as to avoid the oxidation of copper to copper oxide(s) which may lead to a reduction of electrical conductivity. The present inventors have however surprisingly found that copper-based ink compositions (i.e. if the ink composition comprises a source of transition metal ions, wherein the transition metal is copper) may also be thermally treated under a normal (i.e. oxygen-containing) gas atmosphere without significant oxidation of copper to copper oxide(s), if the heat is supplied by near infrared (NIR) irradiation.

Thus, in an embodiment, the step (b) of thermally treating and/or irradiating the ink composition comprises a heat treatment by means of near infrared (NIR) irradiation and/or an irradiation with near infrared radiation. The term "near infrared", as used herein, typically includes radiation having a wavelength of from 600 to 1500 nm, in particular from 800 to 1200 nm. In this embodiment, the metal (present as the source of transition metal ions) may in particular be copper and the heat treatment and/or irradiation may be performed under normal (i.e. oxygen-containing) gas atmosphere. By taking this measure, a copper conductor may be obtained without the necessity of an inert gas atmosphere, thereby reducing process costs. This approach is even applicable for manufacturing of non-deformable conductors (i.e. wherein a polymer and/or polymer precursor may be omitted in the ink composition) in accordance with a sixth aspect of the present invention to be discussed below.

In an embodiment, the step (b) of irradiating the ink composition comprises irradiating the ink composition with an energy-carrying activation beam, in particular electromagnetic radiation, in particular selected from the group consisting of ultraviolet radiation, visible light radiation, infrared radiation and microwave radiation.

In an embodiment, the step (b) of thermally treating and/or irradiating the ink composition is carried out such that transition metal ions (stemming from the source of transition metal ions) are reduced by the reducing agent and (at the same time (simultaneously) or subsequently, in particular once (after) at least 50% of the transition metal ions are reduced) the polymer and/or polymer precursor is polymerized via the polymerizable terminal multiple bond.

In an embodiment, the step (b) of thermally treating and/or irradiating the ink composition comprises a step (b1) of reducing transition metal ions (stemming from the source of transition metal ions) by the reducing agent and (in particular followed by) a step (b2) of polymerizing the polymer precursor via the polymerizable terminal multiple bond. In particular, it may be advantageous if the reduction of transition metal ions begins and proceeds very quickly, which may promote the formation of a large plurality of very small metal particles, such as metal micro- and/or nanoparticles, rather than large particles.

In particular, the step (b2) of polymerizing the polymer precursor via the polymerizable terminal multiple bond may be carried out once (after) at least 50% of the transition metal ions are reduced. For instance, the temperature in the thermal treatment step (b) may be gradually increased such that at an initial lower temperature, the reduction of the transition metal ions takes place by the reducing agent and, subsequently, at a higher temperature the polymerization of the polymer precursor via the polymerizable terminal multiple bond may be carried out. This gradual temperature increase may be for instance very easily realized by the presence of an appropriate solvent and/or complexing agent, which upon thermal treatment initially evaporates and thereby initially maintains the temperature of the ink composition at a relatively low temperature. During this period of solvent and/or complexing agent evaporation, a considerable part of the transition metal ions (which may have become exposed by the evaporation of any complexing ligands) may be reduced by the reducing agent contained in the ink composition, while the polymerization reaction may not yet be initiated. Once the solvent and/or complexing agent is substantially evaporated, the temperature of the ink composition may further increase such that also the polymerization reaction may be initiated and the thus forming polymer matrix may in situ encapsulate or embed previously formed metal particles, in particular metal micro- and/or nanoparticles.

As a result, an in-situ formed composite material wherein nanoparticles are embedded (in particular homogenously dispersed) in a polymer matrix may be obtained. Thus, in an embodiment, the step (b) of thermally treating and/or irradiating the ink composition is carried out such that metal nanoparticles embedded in a polymer matrix are obtained.

Moreover, a percolated network of metal nano- or micro-structure may be formed by decomposing an unstable self-reducing complex or salt of the transition metal ions with the reducing agent. Thus, in an embodiment, the step (b) of thermally treating and/or irradiating the ink composition is carried out such that a percolated network of metal nano- or microstructure is formed.

In an embodiment, a thickness of the thermally treated and/or irradiated (cured) ink after step (b) is from 100 nm to 10 µm, in particular from 200 nm to 5 µm, in particular from 250 nm to 2.5 µm, in particular from 500 nm to 2 µm, in particular from 600 to 1300 nm.

In an embodiment, the method of manufacturing a deformable conductor further comprises, after a step (b) of thermally treating the ink composition, a step of irradiating at least part of the thermally treated ink with an energy-carrying activation beam, in particular electromagnetic radiation. In particular, the thermally treated ink may be irradiated with intense pulsed light (IPL). By taking this measure, which may also be referred to as photonic curing, metal particles may be sintered, thereby significantly decreasing the resistivity of the composite material. Without wishing to be bound by any theory, the inventors assume that by means of IPL, an isolating organic layer which may surround the metal particles may be at least partially destroyed and/or unreacted monomers or additives may be decomposed. The present inventors have found that the resistivity of the composite material may be reduced by up to 95% and in average by about 50% by means of IPL (for example a drop in resistivity from $4.7 \cdot 10^{-5}$ Ω·m (before IPL) to $1.4 \cdot 10^{-5}$ Ω·m (after IPL) could be observed).

In an embodiment, the ink composition in step (a) is applied on at least a part of a surface of a (pre-)stretched deformable (such as elastic) substrate, i.e. a substrate not being in relaxed state, but being under tensile load or strain. Subsequently, the step (b) of thermally treating and/or irradiating the ink composition may be carried out while the deformable substrate being still in a stretched state. Alternatively, in particular in case the nature of the deformable substrate does not allow for a thermal treatment and/or irradiation in a stretched state, a step of drying (for instance at room temperature, possibly supported by reduced pressure) the ink composition (such that at least part of the transition metal ions (stemming from the source of transition metal ions) are reduced by the reducing agent), followed by a step of releasing the (pre-)streched deformable substrate to its original (unstretched) shape may be carried and subsequently thermally treating and/or irradiating in an unstretched state may be carried. By taking these measures, a deformable conductor having increased conductivity at high strains (compared to deformable conductor without "prestretching") may be obtained.

In a fourth aspect, the present invention relates to a deformable (such as elastic, flexible, stretchable, plastic) conductor (e.g. conductive trace, composite material, ISNC) obtainable by the method according to the third aspect.

The conductor may for instance represent a conductive trace, such as a conductive trace formed or arranged on a substrate, such as a deformable substrate. The conductor may also represent a conductor path, a wiring, or an electrical contact.

In an embodiment, the deformable conductor comprises metal nanoparticles embedded in a polymer matrix, such as a percolated network of metal nanoparticles.

In an embodiment, the metal nanoparticles have an average particle size (average particle diameter) of from 5 to 500 nm, in particular of from 10 to 250 nm, in particular of from 25 to 100 nm, in particular of from 30 to 75 nm, in particular of from 40 to 60 nm, such as about 50 nm. The determination of an average particle size or an average particle diameter is known to a person skilled in the art and can be performed for instance by visual microscopic observation with an appropriate magnification, for instance by using an electron microscope (such as a transmission electron microscope (TEM) or a high resolution scanning electron microscope (SEM)) and by randomly selecting an appropriate number of particles and calculating the average of the individual particle diameters.

In a fifth aspect, the present invention relates to an electronic device, in particular a wearable and/or stretchable electronic device, comprising the deformable (such as elastic, flexible, stretchable, plastic) conductor according to the fourth aspect.

In an embodiment, the conductor may form a conductive trace, a conductor path, a wiring, or an electrical contact of the electronic device.

In an embodiment, the electronic device is selected from the group consisting of an adhesive patch, a wearable display, a printed circuit, a printed wiring board, a transistor, an antenna, a radio-frequency identification (RFID) tag, a semitransparent or transparent coating, a light-emitting diode (LED), in particular an organic light-emitting diode (OLED), a solar cell, a capacitor, a sensor, a battery electrode, an organic memory device, a thermoformed wiring board or other devices manufactured by thermoforming, thermoshrinking or enveloping.

In a sixth aspect, the present invention relates to a method of manufacturing a conductor, the method comprising the steps of (a) applying an ink composition comprising a source of transition metal ions and a reducing agent on at least a part of a surface of a substrate, and (b) thermally treating the ink composition by means of near infrared (NIR) irradiation and/or irradiating the ink composition with near infrared radiation.

The source of transition metal ions, the reducing agent and the further ingredients or components, as described in detail above with regard to the ink composition of the first aspect, may also be comprised in the ink composition used in the method according to the sixth aspect. Likewise, the ink composition used in the method according to the sixth aspect may be provided as a kit, as it has been described in further detail above with regard to the second aspect. The details of the method of the third aspect may also be applicable to the method according to the sixth aspect. For the avoidance of repetitions, reference is therefore made to the disclosure provided above in the context of the first to third aspects.

In particular, the ink composition as used in the method according to the sixth aspect may correspond to the ink composition according to the first aspect, except for a polymer and/or a polymer precursor—while not excluded—may be omitted in the ink composition as used in the method according to the sixth aspect.

In an embodiment, the transition metal comprises copper. Conventionally, copper-based ink compositions may generally only be heat treated under an inert gas atmosphere. Otherwise, a significant oxidation of copper to copper oxide(s) may occur which may lead to a reduction of electrical conductivity. The present inventors have however surprisingly found that copper-based ink compositions (i.e. if the ink composition comprises a source of transition metal ions, wherein the transition metal is copper) may also be thermally treated by means of near infrared (NIR) irradiation under a normal (i.e. oxygen-containing) gas atmosphere without significant oxidation of copper to copper oxide(s). As a result, a copper conductor may be obtained without the necessity of an inert gas atmosphere, thereby rendering its manufacture very cost-efficient.

The material of the substrate is not particularly limited, as long as it is capable of being wettable by an ink composition as described in the foregoing and/or capable of bearing the later formed conductor obtained from the ink composition upon thermal treatment and/or irradiation on its surface. While not excluded, the material of the substrate does not need to be deformable (such as elastic or plastic), but may also be rigid.

In an embodiment, the step (b) of thermally treating and/or irradiating the ink composition is carried out under normal gas atmosphere. The term "normal gas atmosphere", as used herein, may in particular denote an oxygen-containing gas atmosphere, such as (ambient) air. More specifically, an inert gas atmosphere—while not excluded—may be dispensable so that the process costs may be significantly reduced.

In a seventh aspect, the present invention relates to a conductor obtainable by the method according to the sixth aspect. The conductor may for instance represent a conductive trace, such as a conductive trace formed or arranged on a substrate. The conductor may also represent a conductor path, a wiring, or an electrical contact.

In an eighth aspect, the present invention relates to an electronic device comprising the conductor according to the seventh aspect.

In an embodiment, the conductor may form a conductive trace, a conductor path, a wiring, or an electrical contact of the electronic device.

In an embodiment, the electronic device is selected from the group consisting of a printed circuit, a printed wiring board, a transistor, an antenna, a radio-frequency identification (RFID) tag, a semitransparent or transparent coating, a light-emitting diode (LED), in particular an organic light-emitting diode (OLED), a solar cell, a capacitor, a sensor, a battery electrode and an organic memory device.

The present invention is further described by the following examples, which are solely for the purpose of illustrating specific embodiments, and are not construed as limiting the scope of the invention in any way.

EXAMPLES

Materials tert-Butylamine (Sigma Aldrich, ≥99.5%), acetic acid (Sigma Aldrich, ≥99%), silver oxide (Tianjin Yinlida Chemical Co., LTD, ≥99%), formic acid (Sigma Aldrich, ≥95%), 2-hydroxyethylcellulose (Sigma Aldrich, $M_w$=1.3× $10^6$ g/mol), TEGO Foamex® 810 (defoamer, polyether siloxane copolymer, contains fumed silica; Evonik), TEGO Foamex® 883 (defoamer, polyether siloxane; Evonik), polyethylene glycol-polydimethylsiloxane block copolymer (ABCR GmbH & Co. KG), 4-acryloylmorpholine (Sigma Aldrich, 97%), 4,4'-Azobis(4-cyanovaleric)acid (Sigma Aldrich, ≥98%), were all used as received.

Formulation of Ink Components (for a Standard Portion of Approx. 150 g of Ink):

A—silver base: 30-50 mL of DI water was placed in a Schott Duran® laboratory bottle (100 mL). A volume of 55 mL of tert-butylamine was added and the mixture was frozen by first placing the closed bottle in a liquid nitrogen-acetone bath and then in liquid nitrogen for 5 min. To the frozen mixture 11.5 mL (200 mmol) of acetic acid was added. The bottle was sealed and allowed to stand, with occasional shaking, until it reached a temperature of approximately 10° C. To the cool solution, 23.25 g of silver oxide was added and the suspension was stirred until it became almost transparent. After 4 h of stirring, the solution was filtered (Cobetter Filtration; PFSA2-0500-47-5, 5.0 μm; Ø=47 mm) to remove most of the remaining undissolved black colloidal residue. Alternatively, a syringe filter of 0.45 or 1-2 μm could be used.

Alternatively, solution A can be prepared using silver oxide and pre-synthesized tert-butylammonium acetate, or directly from commercial silver acetate. In these cases, the same molar equivalents of the substrates are to be used.

B—formate solution: 6 mL of DI water was placed in a Schott Duran® laboratory bottle (50 mL). A volume of 32 mL of tert-butylamine was added and the mixture was frozen by first placing the closed bottle in a liquid nitrogen-acetone bath and then in liquid nitrogen for 5 min. To the frozen mixture 8.4 mL (211 mmol) of formic acid was added. The sealed bottle was allowed to stand, with occasional shaking, until it reached a temperature of approx. 10° C. The bottle was opened to equilibrate with atmospheric pressure, and then warmed in a water bath until the tert-butylammonium formate completely dissolved. The viscous solution of the salt can be stored at room temperature. Alternatively, a solution of pre-synthesized tert-butylammonium formate can be used.

C—mixture of polymer and further additives: HEC (1200-1500 mg) was placed in a glass vial (20 mL). The defoamers TEGO Foamex® 810 (200-400 mg), TEGO Foamex® 883 (0-100 mg), PEG-PDMS-PEG triblock-co-polymer (200-400 mg) and 2.4-3.2 mL (2.7-3.6 g, 19-25 mmol) of ACMO was added. It is advisable to prepare this suspension directly before use, as the components may lead to the slow swelling of HEC. The suspension should be stirred directly before addition, in order to avoid precipitation of HEC.

Ink Preparation

Components A and B are indefinitely stable when refrigerated. The combined components A and B were stirred with a laboratory homogenizer (Ultra Turrax), while component C was added dropwise with a disposable plastic pipette. After approx. 10 min of stirring, the ink was placed in the refrigerator at 4-8° C. and the HEC was allowed to swell for 48 h. The initiator (4,4'-Azobis(4-cyanovaleric) acid; ABCVA), 200 mg, 0.71 mmol) was then added and the ink was stirred in a biaxial centrifugal stirrer (StateMix, Vortex Mixer VM-200). Alternatively it can be homogenized using the laboratory homogenizer (a few mL of tert-butylamine may be added to compensate the evaporating amine). The ink was allowed to stand for another 4 days in the refrigerator to complete the swelling of HEC. After repeated stirring, the ink was filtered on a stainless steel mesh filter membrane (Cobetter Filtration; CSSC-7000-47-10; 70 μm; Ø=47 mm) and stored refrigerated. The ink was stirred again shortly before screen printing.

Exemplary Ink Compositions for Representative ISNCs
ISNC-1

Component A: 34 mL water; Component C: 1350 mg HEC, 2.8 mL (3.14 g, 22.17 mmol) ACMO, 300 mg TEGO Foamex® 810, 100 mg TEGO Foamex® 883, 260 mg PEG-PDMS-PEG triblock-copolymer.

ISNC-2

Component A: 40 mL water; Component C: 1400 mg HEC, 2.8 mL (3.14 g, 22.17 mmol) ACMO, 300 mg TEGO Foamex® 810, 100 mg TEGO Foamex® 883, 300 mg PEG-PDMS-PEG triblock-copolymer.

Printing and Oven Curing

The ink was printed on TPU foils (Platilon® U073, Covestro) with a thickness of 25 μm or 75 μm cut to a size of roughly 35×25 cm using a THIEME Lab 1000 screen printer, using a A 55/63 polyester mesh screen. After printing, the foils were transferred to a metal plate and immediately cured in an oven at 100° C. for 40 min.

Photonic Curing

Selected composite structures were irradiated with IPL using a photonic curing device (PulseForge 1200, Novacentrix, USA). An optimised sintering procedure consisting of 8 μ-pulses with overall length of 3000 μs was applied at a voltage span between 240 and 280 V which corresponds to 634 and 959 mJ·cm$^{-2}$ of emitted optical energy. The curing with fixed settings was repeated several times to obtain a stable electrical resistance.

Post-Characterisation with Electron Microscopy

The thickness of the cured patterns was characterized by scanning electron microscopy (SEM—Zeiss LEO 1525) and with focused ion beam (FIB) cross-sectioning (Zeiss LEO 1540 dual beam workstation).

In-Situ Cyclic Straining with Electrical Resistance

The resistance-strain dependency was tested with a self-made strain test bench, which allows for a continuous resistance measurement at a sampling frequency of 0.2 Hz using a Ketihley 2410 SMU in the range of 2Ω to 200 MΩ. In order to avoid measurement artefacts from the plastic deformation of the substrates the tested samples were pre-strained by 15%. In a typical experiment, a silver conductor line with a length of 10 cm and a width of 2 mm was pre-strained by 15% and then stretched and released to increasing additional applied engineering strains of 1, 2, 5, 10, 20, 30, 40, 50, 70 and 85%. The total applied strain was thus 100% (including pre-strain and additional strain) at the end of the experiment. Ten cycles were performed for each strain level before the strain was increased for the next step. The experiment was performed at a speed of 1 mm/s. A hold time of 1 s was set after each straining/releasing segment. The results are shown in Table 1.

TABLE 1

| | Resistivity P [Ω · m · 10$^{-6}$] | R/R$_0$-at 50% strain | Comment |
|---|---|---|---|
| ISNC-1 *[1] | 28.4 | 10.8 | Exemplary formulation with minimal resistivity |
| ISNC-2 *[1] | 46.7 | 5.3 | Exemplary formulation with minimal R/R$_0$ |
| ISNC-1-no initiator *[1] | 12.0 | 57.4 | Same formulation as ISNC-1, but without the addition of radical initiator |
| ISNC-2-IPL *[1] | 14.0 | 7.4 | ISNC-2 with additional post-treatment with IPL |
| X-1 *[2] | 8.2 | 70.2 | Commercial ink based on silver flakes |

TABLE 1-continued

| | Resistivity P [Ω · m · 10$^{-6}$] | R/R$_0$-at 50% strain | Comment |
|---|---|---|---|
| X-2 *[2] | 42.1 | 39.4 | Commercial ink based on silver flakes |
| X-3 *[2] | 37.0 | 26.5 | Commercial ink based on silver flakes |
| X-4 *[2] | 2740 | 13.1 | Commercial ink based on conductive carbon fillers |
| X-5 *[2] | 1830 | 18.7 | Commercial PEDOT:PSS ink |
| X-6 *[2] | 1370 | 9.3 | Commercial PEDOT:PSS ink |

*[1] Working Example
*[2] Comparative Example

As evident from the results shown in Table 1, by utilizing exemplary ink compositions according to the present invent an excellent electrical conductivity (as apparent from a low resistivity) even under high strain (as apparent from low R/R$_0$ values) may be achieved. The addition of a radical initiator has shown to improve the electrical conductivity under strain. An additional post-treatment with intense pulsed light (IPL) drastically increases the electrical conductivity.

While the present invention has been described in detail by way of specific embodiments and examples, the invention is not limited thereto and various alterations and modifications are possible, without departing from the scope of the invention.

The invention claimed is:

1. A method of manufacturing a deformable conductor, the method comprising the steps of:

(a) applying an ink composition on at least a part of a surface of a deformable substrate;

(b) thermally treating and/or irradiating the ink composition;

wherein the ink composition comprises:

a source of transition metal ions, wherein the transition metal comprises at least one of silver and copper;

a complexing agent selected from the group consisting of an alkyl amine having a primary amine functional group or a salt thereof;

a reducing agent selected from the group consisting of formate, carbamate and combinations thereof;

a polymer and/or a polymer precursor, the polymer precursor comprising a polymerizable terminal multiple bond; and a polymerization initiator, wherein the polymerization initiator comprises a thermal initiator.

2. The method of manufacturing a deformable conductor according to claim 1, wherein at least one of the following features is fulfilled:

the step (a) of applying an ink composition on at least a part of a surface of a deformable substrate comprises printing the ink composition on at least a part of a surface of a deformable substrate; and/or the step (a) of applying an ink composition comprises applying the ink composition on only a part of a surface of the deformable substrate; and/or a thickness of the applied ink composition is from 5 μm to 200 μm; and/or the deformable substrate comprises at least one polymer material; and/or the step (b) of thermally treating the ink composition comprises a treatment at a temperature of from 40° C. to 300° C. and for a period of time of from 5 min to 90 min; and/or the step (b) of thermally treating and/or irradiating the ink composition comprises a heat treatment by means of near infrared (NIR) irradiation and/or an irradiation with near infrared radiation.

3. The method of manufacturing a deformable conductor according to claim 1, wherein the step (b) of thermally treating and/or irradiating the ink composition comprises a step (b1) of reducing transition metal ions by the reducing agent and a step (b2) of polymerizing the polymer precursor via the polymerizable terminal multiple bond.

4. The method of manufacturing a deformable conductor according to claim 3, wherein the step (b2) of polymerizing the polymer precursor via the polymerizable terminal multiple bond is carried out once at least 50% of the transition metal ions are reduced.

5. The method of manufacturing a deformable conductor according to claim 1, wherein at least one of the following features is fulfilled:

the step (b) of thermally treating and/or irradiating the ink composition is carried out such that a percolated network of metal nano- or microstructure is formed; and/or the step (b) of thermally treating and/or irradiating the ink composition is carried out such that metal nanoparticles embedded in a polymer matrix are obtained; and/or a thickness of the thermally treated and/or irradiated ink after step (b) is from 100 nm to 10 μm; and/or further comprising, after a step (b) of thermally treating the ink composition, a step of irradiating at least part of the thermally treated ink with an energy-carrying activation beam.

6. The method of manufacturing a deformable conductor according to claim 1, wherein in step (a) the ink composition is applied on at least a part of a surface of a stretched deformable substrate.

7. The method of manufacturing a deformable conductor according to claim 6, wherein the step (b) of thermally treating and/or irradiating the ink composition is carried out while the deformable substrate being still in a stretched state; or further comprising, prior to step (b), a step of drying the ink composition, followed by a step of releasing the stretched deformable substrate to its original shape.

* * * * *